(12) United States Patent
Tetsuka et al.

(10) Patent No.: US 8,926,790 B2
(45) Date of Patent: Jan. 6, 2015

(54) PLASMA PROCESSING APPARATUS

(75) Inventors: Tsutomu Tetsuka, Kasumigaura (JP);
Toshio Masuda, Hino (JP); Naoshi Itabashi, Hachioji (JP); Masanori Kadotani, Kudamatsu (JP); Takashi Fujii, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1752 days.

(21) Appl. No.: 11/508,187

(22) Filed: Aug. 23, 2006

(65) Prior Publication Data
US 2007/0044716 A1    Mar. 1, 2007

(30) Foreign Application Priority Data
Aug. 24, 2005  (JP) .................................. 2005-242080

(51) Int. Cl.
   *H01J 37/32*     (2006.01)
   *C23C 16/455*    (2006.01)
   *C23C 16/44*     (2006.01)
   *C23C 16/505*    (2006.01)

(52) U.S. Cl.
   CPC ......... *H01J 37/32082* (2013.01); *C23C 16/505* (2013.01); *H01J 37/32495* (2013.01); *C23C 16/45565* (2013.01); *H01J 37/32477* (2013.01); *C23C 16/4401* (2013.01); *H01J 37/32559* (2013.01); *H01J 37/3244* (2013.01); *H01J 37/32504* (2013.01)
   USPC ............ 156/345.34; 156/345.33; 156/345.48; 118/715; 118/723 I

(58) Field of Classification Search
   CPC ............ H01J 37/32082; H01J 37/3244; H01J 37/32504; H01J 37/32477; H01J 37/32495; H01J 32/32559; C23C 16/4401; C23C 16/45565; C23C 16/50577

USPC .............. 118/715, 723 I; 156/345.33, 345.34, 156/345.48
See application file for complete search history.

(56) References Cited

U.S. PATENT DOCUMENTS

| 5,085,727 | A | * | 2/1992 | Steger ...................... 156/345.47 |
| 5,268,200 | A | * | 12/1993 | Steger .......................... 427/577 |
| 5,522,932 | A | * | 6/1996 | Wong et al. ................... 118/715 |
| 5,589,002 | A | * | 12/1996 | Su .............................. 118/723 E |

(Continued)

FOREIGN PATENT DOCUMENTS

| JP | 2001-077031 | 3/2001 |
| JP | 2001-267305 | 9/2001 |

(Continued)

*Primary Examiner* — Jeffrie R Lund
(74) *Attorney, Agent, or Firm* — Antonelli, Terry, Stout & Kraus, LLP

(57) ABSTRACT

The invention provides a plasma processing apparatus aimed at suppressing the corrosion caused by reactive gas and heavy-metal contamination caused by plasma damage of components constituting the high-frequency electrode and gas supply unit. The plasma processing apparatus comprises a processing chamber 1 for subjecting a processing substrate 4 to plasma processing, gas supply means 17, 16 and 11 for feeding gas to the processing chamber 1, and an antenna electrode 10 for supplying high-frequency radiation for discharging the gas to generate plasma, wherein the gas supply means includes a gas shower plate 11 having gas discharge holes on the surface exposed to plasma, and a portion of or a whole surface of the conductor 10 exposed to gas constituting the antenna-electrode side of the gas supply means is subjected to ceramic spraying containing no heavy metal to form a protecting film 12.

8 Claims, 6 Drawing Sheets

(56) References Cited

U.S. PATENT DOCUMENTS

| | | | |
|---|---|---|---|
| 5,593,541 A * | 1/1997 | Wong et al. | 438/654 |
| 5,680,013 A * | 10/1997 | Dornfest et al. | 315/111.21 |
| 5,792,269 A * | 8/1998 | Deacon et al. | 118/715 |
| 5,891,253 A * | 4/1999 | Wong et al. | 118/726 |
| 5,945,166 A * | 8/1999 | Singh et al. | 427/376.2 |
| 6,171,460 B1 * | 1/2001 | Bill | 204/291 |
| 6,460,482 B1 * | 10/2002 | Kuibira et al. | 118/723 R |
| 6,533,910 B2 * | 3/2003 | O'Donnell et al. | 204/298.31 |
| 6,592,707 B2 * | 7/2003 | Shih et al. | 156/345.1 |
| 6,790,242 B2 * | 9/2004 | O'Donnell et al. | 29/25.01 |
| 7,387,685 B2 * | 6/2008 | Carpenter et al. | 118/715 |
| 7,699,932 B2 * | 4/2010 | Miller et al. | 118/715 |
| 7,785,417 B2 * | 8/2010 | Ni et al. | 118/715 |
| 2001/0006070 A1 * | 7/2001 | Shang et al. | 134/1 |
| 2002/0066532 A1 * | 6/2002 | Shih et al. | 156/345.1 |
| 2002/0144783 A1 * | 10/2002 | Tran et al. | 156/345.33 |
| 2003/0051665 A1 * | 3/2003 | Zhao et al. | 118/723 E |
| 2004/0050495 A1 * | 3/2004 | Sumiya et al. | 156/345.48 |
| 2005/0051273 A1 * | 3/2005 | Maeda et al. | 156/345.48 |
| 2005/0087297 A1 * | 4/2005 | Kitsunai et al. | 156/345.24 |
| 2005/0126712 A1 * | 6/2005 | Sumiya et al. | 156/345.48 |
| 2006/0016559 A1 * | 1/2006 | Kobayashi et al. | 156/345.34 |
| 2006/0105583 A1 * | 5/2006 | Ikeda et al. | 438/788 |
| 2006/0137608 A1 * | 6/2006 | Choi et al. | 118/715 |
| 2006/0169410 A1 * | 8/2006 | Maeda et al. | 156/345.28 |
| 2006/0269690 A1 * | 11/2006 | Watanabe et al. | 427/569 |
| 2007/0026540 A1 * | 2/2007 | Nooten et al. | 438/5 |
| 2007/0044716 A1 * | 3/2007 | Tetsuka et al. | 118/723 I |
| 2008/0210376 A1 * | 9/2008 | Maeda et al. | 156/345.24 |
| 2008/0257863 A1 * | 10/2008 | Kitsunai et al. | 216/67 |
| 2013/0199728 A1 * | 8/2013 | Kobayashi et al. | 156/345.34 |

FOREIGN PATENT DOCUMENTS

| | | |
|---|---|---|
| JP | 2003-243365 | 8/2003 |
| JP | 2003-243372 | 8/2003 |
| JP | 2004-079784 | 3/2004 |
| JP | 2004-190136 | 7/2004 |
| JP | 2004-260159 | 9/2004 |
| JP | 2005-203491 | 7/2005 |
| WO | WO 03/036680 | 5/2003 |

* cited by examiner

US 8,926,790 B2

PLASMA PROCESSING APPARATUS

The present application is based on and claims priority of Japanese patent application No. 2005-242080 filed on Aug. 24, 2005, the entire contents of which are hereby incorporated by reference.

BACKGROUND OF THE INVENTION

1. Field of the Invention

The present invention relates to a plasma processing apparatus, and more specifically, relates to a plasma processing apparatus capable of subjecting a semiconductor device formed on a substrate using corrosive gas, and a plasma processing apparatus capable of processing a sample stably without causing heavy-metal contamination of the surface of the sample.

2. Description of the Related Art

A plasma processing apparatus utilizing plasma is widely used for manufacturing semiconductor devices. Especially, in a plasma etching process for forming semiconductor circuit structures, process gases containing halogen-based substances having high reactivity to silicon (hereinafter referred to as Si) compounds and aluminum (hereinafter referred to as Al) alloy and the like constituting the circuits are used. Therefore, alumite-treated aluminum (anodized aluminum) and stainless steel having high resistance to process gases have been used in general as the components constituting the processing chamber in which plasma is generated.

FIG. 9 illustrates a typical example of the arrangement of a prior art plasma processing apparatus. The processing apparatus comprises a lower electrode 104 for placing a wafer 103 within a processing chamber 101 capable of having its interior vacuumed, and a high-frequency electrode 102 for generating plasma 102 is attached via an insulating body 108 to the processing chamber 101. Upon generating plasma 102, the process gas supplied from a gas supply means 105 is supplied into the processing chamber 101 via gas discharge holes 107 formed to a gas shower plate 106 disposed on a front side of the high-frequency electrode 120. The high-frequency radiation for generating plasma is generally an electromagnetic wave ranging from 13 MHz to a few hundred MHz, which is applied from a high-frequency power supply 110 via a matching box 109 to the high-frequency electrode 120, so as to irradiate an electric field required for discharge to the plasma.

For example, in a semiconductor manufacturing step for etching Si compounds, a halogen gas such as chlorine is fed to the processing chamber so that the gas pressure is maintained constantly within the range of approximately 0.1 Pa to 10 Pa, and high-frequency power for generating plasma ranging from a few hundred W to a few k W is applied to the high-frequency electrode 120. Moreover, in order to control the ion irradiation energy from the plasma to the wafer 103, normally a high-frequency radiation of a few hundred kHz to a few MHz is applied to the lower electrode 104, according to which the potential of the wafer 103 ranges between tens to hundreds of V, and the ions irradiated to the wafer 103 are accelerated.

Therefore, a high-frequency electric field of approximately a few hundred V is generated in the plasma-generating high-frequency electrode 120 and the wafer 103, and the surface of the high-frequency electrode 120, especially the surface of the gas shower plate 106, and the inner surface of the processing chamber 101 coming into contact with plasma 102 are subjected to sputtering by ions irradiated from plasma and attaching of reactive radicals, and therefore, are susceptible to corrosion. Generally, in order to cope with this problem, an Al treated with hard alumite (anodized aluminum) coating or stainless steel (hereinafter referred to as SUS) are used as the base material for forming the high-frequency electrode 120 and the processing chamber 101 (refer for example to Japanese Patent Application Laid-Open Publication Nos. 2004-190136 and 2003-243372, hereinafter referred to as patent documents 1 and 2), or the surface exposed to plasma is partially coated by spraying ceramic material.

However, during mass production processes performed continuously for a long period of time in factories and the like, the load of heat flow cycles caused by plasma discharge cycles of plasma 102 ranging between a few hundred W to a few k W is applied on the surface of the high-frequency electrode 120 and the processing chamber 101 exposed to plasma 102. Therefore, the aluminum base material is subjected to thermal contraction, causing the alumite coating to be cracked and removed, and the base material is corroded through the cracked portion, causing the device to be contaminated by the small amount of heavy-metal compounds such as iron (hereinafter referred to as Fe), magnesium (hereinafter referred to as Mg) and chrome (hereinafter referred to as Cr) contained in the base material, or causing defective circuit pattern by the small particles generated by corrosion. Such metal contamination can be reduced by using a high-purity material containing very little heavy metal as the spraying material for creating a ceramic sprayed film having a relatively thick film thickness (approximately a few hundred μm). However, high cost is required for performing a spraying process using high-purity material, and the sprayed film has a drawback in that when it is used as the surface protecting film of a high-frequency electrode 120 applying high-power radiation, it is susceptible to consumption by ion sputtering and the life thereof is short.

Along with the recent miniaturization of semiconductor devices, the permissible level of metal contamination and quantity of generated particles has become stricter, so it has become difficult according to the prior art to achieve the permissible level of heavy-metal contamination caused by the high-frequency electrode and the processing chamber and the quantity of particles caused by reactive gas corrosion. Especially, the surface of the high-frequency electrode is damaged significantly via plasma ion sputtering in the high-power high-frequency electric field, so the most important problem to be solved is to prevent damage of the high-frequency electrode and significantly reduce generation of heavy metal and particles from the base material constituting the electrode. At this time, the high-frequency electrode enables to generate uniform high-density plasma by applying a high-frequency electric field to the plasma in a uniform and efficient manner, so it is important to ensure the effective properties of the electrode related to the propagation of the high-frequency electric field and the interaction of the electric field with plasma. Furthermore, by feeding process gas uniformly toward the wafer, it becomes possible to process the whole surface of the wafer uniformly by controlling the generation and flow of active radicals causing chemical reaction. Therefore, there were demands for a plasma processing apparatus with reduced heavy-metal contamination and corrosion by radicals, and at the same time capable of sufficiently satisfying the performance of processes and plasma generation.

SUMMARY OF THE INVENTION

With respect to the problems mentioned above, the present invention aims at providing a plasma processing apparatus for subjecting a semiconductor device to plasma processing using corrosive gas, capable of preventing damage of the high-frequency electrode and significantly reducing the output of heavy metal substances and particles from the base material constituting the electrode. Further, the present invention aims at providing a plasma processing apparatus for subjecting a semiconductor device to plasma processing using corrosive gas, that ensures the effective performances related to propagation of the high-frequency electric field and the interaction between the electric field and plasma.

Furthermore, the present invention aims at providing a plasma processing apparatus for subjecting a semiconductor device to plasma processing using corrosive gas, capable of sufficiently satisfying the performance of plasma generation and processes while suppressing heavy-metal contamination and corrosion by radicals.

In order to solve the problems mentioned above, the first aspect of the present invention provides a plasma processing apparatus comprising a gas supply means for feeding gas into the processing chamber, and an antenna electrode (high-frequency electrode) for supplying high-frequency radiation for discharging the gas and forming plasma, wherein the gas supply means includes a gas shower plate having gas discharge holes formed on a surface exposed to plasma, and a portion of or a whole of a surface of a conductor disposed on the antenna-electrode-side of the gas supply means exposed to gas is coated via ceramic spraying, polymer coating or surface treatment. This arrangement enables to prevent the corrosion by reactive gas of the surface exposed to gas of the antenna electrode with a gas supply means, to reduce the occurrence of contamination of the processing substrate surface caused by elements contained in the conductor constituting the antenna electrode mixing into the gas in the processing chamber, and to reduce defects of circuits formed on the processing substrate caused by particles generated by corrosion attaching to the surface of the processing substrate.

The second aspect of the present invention provides the plasma processing apparatus, wherein the gas shower plate is composed of a dielectric. According to this arrangement, the high-frequency radiation applied to the high-frequency electrode is transmitted on the conductor surface of the high-frequency electrode positioned on the rear side of the gas shower plate, instead of on the gas shower plate exposed to plasma, so the high-frequency electric field at the surface of the gas shower plate formed of a dielectric is weakened, and the damage caused by ions and electrons in the plasma can be reduced. Furthermore, since substances having high resistance to chemical corrosion and not containing heavy metal components can be selected as the material for forming the dielectric, the corrosion of the surface exposed to gas on the rear side of the gas shower plate can be reduced, and heavy-metal contamination of the processing substrate can be prevented further.

The third aspect of the present invention provides the plasma processing apparatus, wherein the gas shower plate is composed of quartz. According to this arrangement, since quartz has high resistance to reactive gas and does not include any heavy metal as impurity, corrosion and heavy metal contamination can be reduced even in a halogen gas-based plasma having strong reactivity.

The fourth aspect of the present invention provides the plasma processing apparatus, wherein the gas shower plate is composed of a ceramic or a substance whose main component is one or more elements selected from a group consisting of Si, carbon (hereinafter referred to as C), Al and yttrium (hereinafter referred to as Y), such as, for example, $Y_2O_3$, $YF_3$, $Al_2O_3$, $Si_3N_4$, SiC and $B_4C$. Thus, since the gas shower plate does not include any heavy metal, heavy metal contamination of the processing substrate will not occur even when the gas shower plate is subjected to ion sputtering.

The fifth aspect of the present invention provides the plasma processing apparatus, wherein the gas pressure at the surface exposed to gas of the antenna electrode and the gas shower plate is 50 Pa or greater. According to this arrangement, since the area where the gas pressure is higher than the gas pressure in the processing chamber is susceptible to corrosive reaction caused by reactive gas, corrosion can be reduced by coating the surface of the area where the gas pressure is high with substance having resistance to reactive gas.

The sixth aspect of the present invention provides the plasma processing apparatus, wherein the ceramic spraying utilizes a ceramic including at least one element selected from a group consisting of Al, Si and Y, such as $Al_2O_3$, SiC and $Si_3N_4$, and after forming the ceramic sprayed film, a sealing treatment using polymer is performed. According to this arrangement, no heavy metal contamination will be caused by the sprayed material, and since the sprayed film is further subjected to a sealing treatment using polymer, cracks are not likely to occur to the sprayed film even when the plasma process is performed continuously for a long period of time and the high-frequency electrode repeatedly expands and contracts along with the thermal cycle, and thus the corrosion of electrode conductor of the base material through cracks formed to the sprayed film that may cause heavy metal contamination is prevented.

The seventh aspect of the present invention provides the plasma processing apparatus, wherein the surface treatment is an alumite treatment (aluminum anodizing treatment) when the base material of the conductor surface is aluminum alloy. According to this arrangement, corrosive reaction can be reduced by coating the surface with alumite (anodized aluminum) having relatively high resistance to reactive gas compared to aluminum.

The eighth aspect of the present invention provides the plasma processing apparatus, wherein the surface treatment comprises forming a coating of polymer or the like or an alumite (anodized aluminum) coating on the surface of the base material of the conductor surface, and on the upper surface thereof, spraying ceramic including at least one element selected from a group consisting of Al, Si and Y, such as $Al_2O_3$, SiC and $Si_3N_4$, and after forming the ceramic spray coating, performing a sealing treatment using polymer. According to this arrangement, high-pressure reactive gas is prevented from coming into contact with the high-frequency electrode surface, and the problem of conductive electrode material being corroded and causing heavy metal contamination will be solved.

The ninth aspect of the present invention provides the plasma processing apparatus, wherein the gas fed to the gas supply means travels through a space formed adjacent to a side wall of the gas shower plate. According to this arrangement, there is no need to provide a gas pipe for supplying gas to the high-frequency electrode, according to which the design of the high-frequency electrode can be simplified and the costs thereof can be reduced, and the coating against reactive gas can be formed easily on the surface of the high-frequency electrode, according to which the coating surface can be made smooth and the coating will not be susceptible to cracks. Furthermore, since gas can be dispersed uniformly in the circumferential direction in the space formed to the side surface of the gas shower plate, it becomes possible to discharge gas through the gas shower plate uniformly in the circumferential direction with respect to the plasma.

The tenth aspect of the present invention provides a plasma processing apparatus, wherein a plate-shaped or sheet-shaped dielectric is disposed between the gas shower plate having the gas discharge holes and the conductor surface of the high-frequency electrode so as to prevent the gas from coming into contact with the conductor surface. According to this arrangement, the dielectric is formed for example of quartz, or a compound including at least one element selected from a group consisting of Si, C, Al and Y, such as $Al_2O_3$, SiC, $Si_3N_4$, or polymer, so that high-pressure gas will not come into contact with the high-frequency electrode surface, and heavy metal contamination caused by the conductor constituting the high-frequency electrode can be prevented.

The eleventh aspect of the present invention provides the plasma processing apparatus, wherein the gas shower plate is composed of a dielectric having a thickness of 20 mm or smaller. According to this arrangement, it becomes possible to maintain plasma generation without weakening the high-frequency electric field applied to the plasma from the high-frequency electrode. The relationship between the high-frequency electrode and plasma having a dielectric body or gas shower plate sandwiched therebetween can be approximated with a capacitor structure, wherein when the dielectric constant of the dielectric is represented by $\in$, the dielectric thickness is represented by d and the dielectric area is represented by s, the capacitor capacity C of the dielectric can be expressed by $C=\in s/d$. When the high-frequency radiation frequency is represented by f, the capacity impedance Z of the dielectric portion can be expressed by $Z=1/(2\pi fC)=d/(2\pi f\in s)$, according to which the impedance of the dielectric increases by thickness d, and the voltage applied to the plasma is reduced in proportion to thickness d. In other words, the thickness of the dielectric should be as thin as possible within the range ensuring the function of the gas shower plate. When utilizing quartz (relative density 2.6) which is normally used widely as a dielectric member in a reaction chamber having an inner diameter of 500 mm, the weight thereof reaches up to approximately 10 kg when the plate thickness is 20 mm. Upon taking into consideration that the gas shower plate is usually periodically subjected to manual cleaning and replacement, the maximum weight of the dielectric or gas shower plate should be 10 kg, so the plate thickness should be 20 mm or smaller. Furthermore, as the plate thickness of the dielectric increases, the material costs thereof increases and the forming of gas discharge holes becomes difficult, by which the processing costs are also increased.

The twelfth aspect of the present invention provides the plasma processing apparatus, wherein the gas shower plate is composed of a dielectric having a thickness of 3 mm or greater and 10 mm or smaller. According to the condition of use of the plasma processing apparatus utilized generally in manufacturing semiconductor devices, a maximum gas pressure of a few hundred Pa occurs to the rear surface of the gas shower plate when the gas pressure within the processing chamber is in the order of tens of Pa or smaller. Thus, the rear surface of the gas shower plate should have a sufficient thickness to endure the stress caused by the gas pressure. The stress σ (MPa) occurring to the gas shower plate can be approximately evaluated by the following expression.

$$\sigma=1.2W \times a \times a/(t \times t)$$

At this time, W represents gas pressure (MPa), a represents radius of gas shower plate (mm), and t represents gas shower plate thickness (mm). If the maximum gas pressure is 1000 Pa, the gas shower plate radius is 250 mm and the plate thickness is 3 mm, the stress a occurring to the gas shower plate is approximately 8 Pa. Since the flexural strength of quartz is approximately 70 Pa, a safety factor of 8 or greater can be ensured by setting the thickness of the gas shower plate to 3 mm or greater. Similarly, when the gas shower plate thickness is 10 mm, the stress a will be approximately 0.8 Pa, according to which the safety factor will be 90 or greater. Therefore, it is effective to select the plate thickness within the range of 3 mm and 10 mm, depending on the required safety factor. By constituting the gas shower plate using a dielectric with a thickness of 3 mm or greater and 10 mm or smaller, it becomes possible to provide a gas shower plate capable of sufficiently enduring the stress caused by gas pressure.

The thirteenth aspect of the present invention provides the plasma processing apparatus, wherein the high-frequency radiation has a frequency ranging between 100 MHz and 500 MHz. According to this arrangement, a uniform plasma generation is enabled since capacity coupling can be realized between the high-frequency electrode and the plasma even if the gas shower plate is formed of dielectric.

The fourteenth aspect of the present invention provides the plasma processing apparatus, wherein the gas discharge holes formed on the gas shower plate are arranged at two or more different locations. According to this arrangement, gas can be supplied uniformly with respect to the plasma.

The fifteenth aspect of the present invention provides the plasma processing apparatus, wherein the conductor surface of the high-frequency electrode opposing to the gas shower plate has dents or bumps formed thereto. According to this arrangement, the high-frequency electric field distribution on the surface of the high-frequency electrode can be adjusted, and the generated plasma distribution can be uniformized.

The sixteenth aspect of the present invention provides the plasma processing apparatus, wherein the gas discharge holes are formed at angles of 5 to 45 degrees to the direction of plate thickness of the gas shower plate. According to this arrangement, fast ions accelerated in the plasma toward the gas shower plate are prevented from passing through the gas holes and reaching the high-frequency electrode surface directly.

By applying the present invention to a plasma processing apparatus, it becomes possible to provide a plasma processing apparatus capable of preventing the surface of the high-frequency electrode from being sputtered by ions and being damaged by plasma, and free of heavy-metal contamination or particles on the processing substrate caused by reactive-gas corrosion. Furthermore, the present invention enables to provide a processing method for manufacturing semiconductor devices, which is free of deterioration of performances of the devices and defective products caused by heavy-metal contamination and particles.

DETAILED DESCRIPTION OF THE PREFERRED EMBODIMENTS

Embodiment 1

Figure 1:
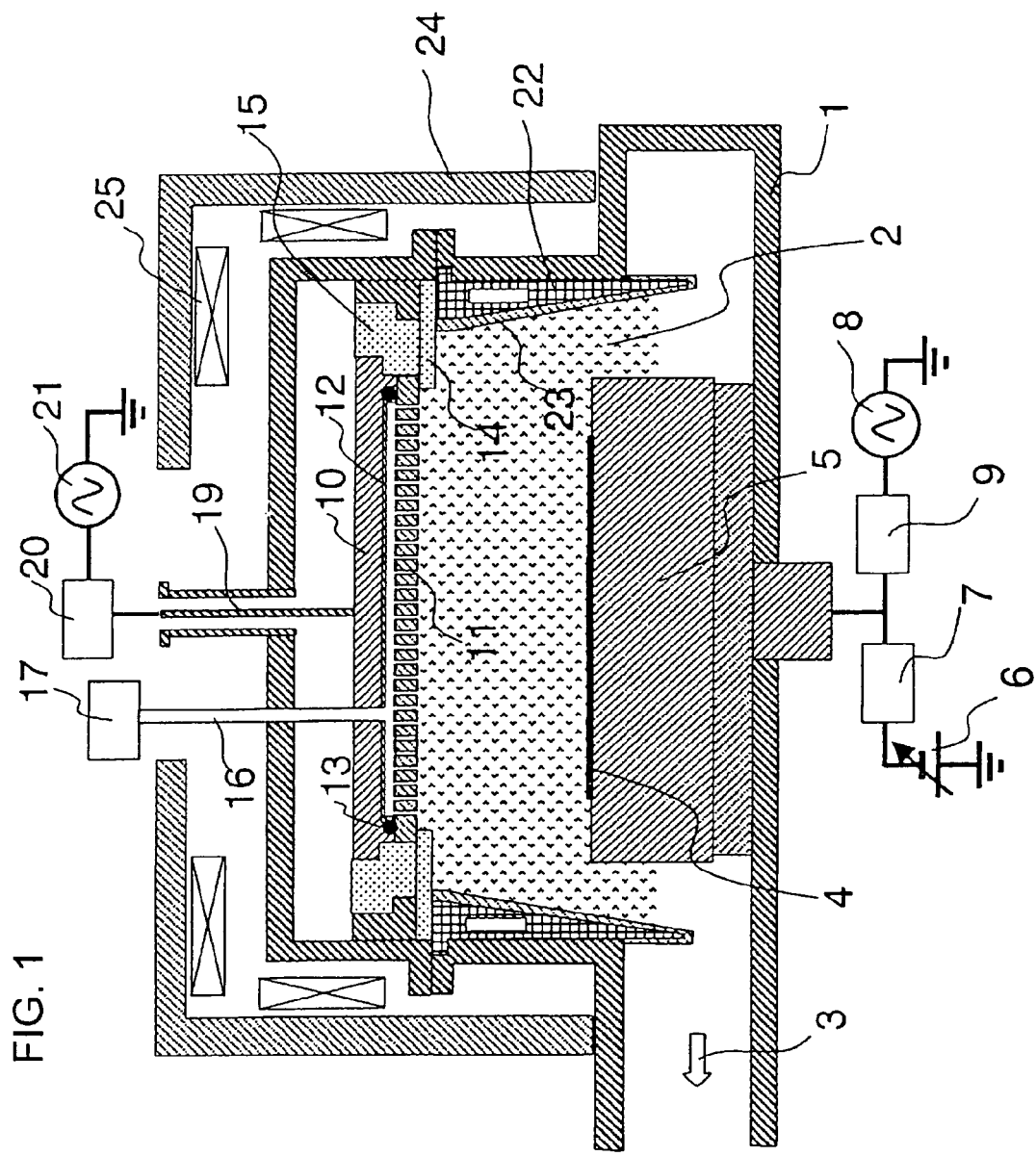
FIG. 1 is a cross-sectional view of a plasma processing apparatus according to a first embodiment of the present invention.

The first preferred embodiment of the present invention will be described with reference to a schematic view of the plasma processing apparatus illustrated in FIG. 1. A substrate 4 to be processed such as a semiconductor wafer or a liquid crystal device substrate is placed on a substrate holding electrode 5 having a function of an electrostatic chuck to which high frequency power can be applied. The substrate holding electrode 5 is equipped with a high-frequency power supply 8 with a frequency of 10 MHz or smaller, a matching circuit 9, and a DC power supply 6 and a filter circuit 7 for realizing electrostatic chuck. The processing chamber 1 is evacuated 3 via an exhaust system not shown, by which the pressure within the processing chamber 1 is controlled to a predetermined pressure. The high-frequency power for generating plasma 2 is supplied from a high-frequency power supply 21 having a frequency of 100 MHz to 500 MHz via an automatic matching box 20 through a coaxial line 19 to a high-frequency electrode 10. In the present embodiment, the frequency of the high-frequency power supply 21 is 200 MHz, and the frequency of the high-frequency power supply 8 is 400 kHz.

The high-frequency electrode 10 has a base material made of aluminum, which is attached to the processing chamber 1 via an insulating member 15 made of quartz and using an O-ring made of polymer not shown so as to maintain the vacuum status of the chamber. The side of the high-frequency electrode 10 facing the plasma 2 has a mechanism for feeding process gas for processing, and the process gas is fed from a process gas supply source 17 with its flow rate controlled via a gas supply pipe 16 to a gas shower plate 11 made of quartz. In a plasma processing apparatus for processing an ordinary wafer with a diameter of 300 mm, the diameter of the gas shower plate 11 ranges between 350 mm and 450 mm. At this time, plasma can be generated uniformly below the gas shower plate 11 by having the electromagnetic waves supplied via the insulating member 15 made of quartz transmit through the interior of the gas shower plate 11 made of quartz. The behavior of the electromagnetic waves transmitted through the interior of the gas shower plate 11 made of dielectric having its upper and lower surfaces sandwiched between a high-frequency electrode 10 and plasma 2 can be computed via numerical analysis. It has been discovered that when utilizing a frequency of 200 MHz, the plate thickness of the dielectric (gas shower plate) 11 should be set within 5 mm and 10 mm in order to enable transmission of the electromagnetic waves within the gas shower plate 11 and realize uniform electric field distribution.

Figure 2:
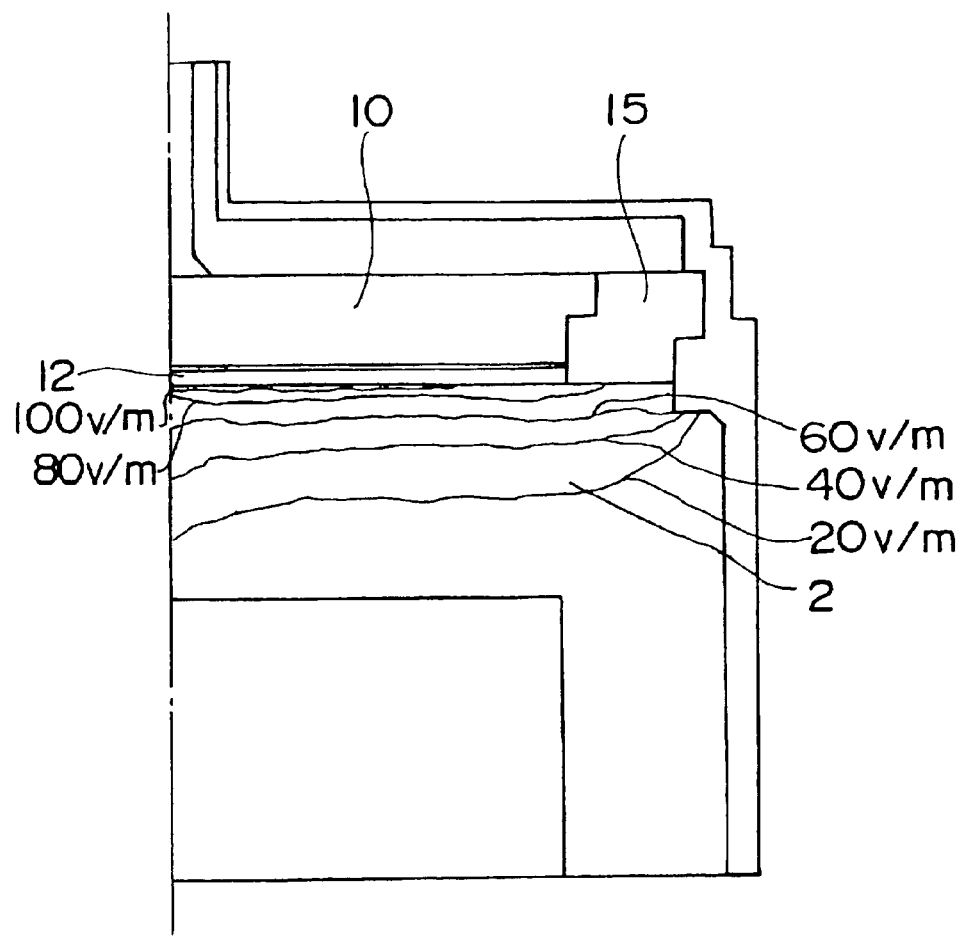
FIG. 2 is a view showing one example of the analysis result of the electric field intensity distribution within the cross-section of the apparatus according to the first embodiment of the present invention.

FIG. 2 illustrates one example of the analysis result. This analysis example illustrates the case in which the thickness of the gas shower plate 11 made of quartz is 6 mm, and the distribution of electric field intensity is shown in the cross-section of the apparatus. In the analysis, the plasma density for an ordinary semiconductor process is assumed, and a case is computed in which the density is $1 \times 10^{11}$ cm$^{-3}$ and uniform, and an electromagnetic wave power of 1 W with a frequency of 200 MHz is applied to the high-frequency electrode. As can be seen from the electric field intensity distribution by the computed result, an electric field with an intensity of 200 V/m or greater is transmitted through the whole interior of the quartz member with a thickness of 6 mm, so that high electric field is applied uniformly to the plasma in an effective manner. Therefore, according to the present embodiment, two types of gas shower plates 11 made of quartz with a diameter of 355 mm was prepared, one with a plate thickness of 6 mm and the other with a plate thickness of 12 mm, so as to evaluate the optimal thickness by experiment and to confirm the effectiveness thereof.

When generating plasma, the gas pressure within the processing chamber 1 is set to approximately 0.1 Pa to 10 Pa, and a high frequency power of 1 kW or smaller is applied to the high-frequency electrode 10, by which a magnetic field in the order of tens to 200 gauss is generated in the plasma 2 by a magnetic field coil 25 and a yoke 24, so as to generate plasma highly efficiently using an electron cyclotron effect. When the frequency of the high-frequency power supply 21 is 200 MHz, the magnetic field intensity required for causing electron cyclotron resonance is approximately 71 gauss, and the distribution of plasma density generation can be controlled by adjusting the magnetic field intensity under the gas shower plate 11, which is the area in which plasma is generated, to be around 71 gauss.

Moreover, by the confinement effect of the magnetic field for confining the generated plasma 2, the distribution of plasma 2 and the transport of plasma 2 to the processing substrate 4 can be controlled by varying the magnetic field coordination by the magnetic field coils 25.

Several tens to several hundreds of V of high-frequency voltage are generated in the processing substrate 4 by the high-frequency power supply 8. In order to reduce the heavy metal contamination of the processing substrate 4 by the generated plasma 2, an inner cylinder 22 formed of aluminum having a good thermal conductivity and capable of having its temperature controlled is disposed on the side surface of the processing chamber 1, and high-purity $Y_2O_3$ ceramic that does not contain heavy metal components is sprayed onto the surface of the inner cylinder 22 coming into contact with plasma 2, forming a protecting film 23. Since the gas pressure within the processing chamber 1 is normally about several Pa, the primary cause of damage of the protecting film 23 and the inner cylinder 22 is the ion sputtering caused by plasma 2 and not the corrosion of the base material of the inner cylinder 22 by chemical reaction, so it is not really necessity to perform a sealing process using polymer to the spray film acting as the protecting film 23. If the protecting film 23 on the surface of the inner cylinder 22 is damaged through long-term continuous processing, the inner cylinder 22 can be replaced in a short time according to the present structure.

Furthermore, although not shown, a protecting cover 14 made of quartz is disposed on the corner portion of the processing chamber 1 in order to protect fixing screws of the gas shower plate 11 from plasma 2. Furthermore, the protecting cover 14 can be formed by disposing a protecting film such as by spraying ceramic and the like on a conductor such as quartz or aluminum and the like, so as to enable control of the distribution of high-frequency electric field excited on the surface of the gas shower plate 11, to thereby control plasma distribution.

A space having a gap of 0.5 mm or smaller is disposed between the high-frequency electrode 10 and the gas shower plate 11, so as to enable the process gas to be diffused laterally and discharged uniformly through gas discharge holes formed on the gas shower plate 11. If the distance of the gap between the high-frequency electrode 10 and the gas shower plate 11 is wide, abnormal discharge may be caused in the electric field generated in the gap, since the gas shower plate 11 is formed of a dielectric. If the gas shower plate 11 disposed close to the high-frequency electrode 10 is formed of a conductor or a semiconductor as according to the prior art, the electromagnetic waves are shielded by the gas shower plate, and the electric field in the gap formed on the rear surface of the gas shower plate 11 is weakened and will not cause abnormal discharge.

The gas shower plate 11 is made of quartz with a plate thickness of 6 mm, and approximately 400 gas discharge holes with a diameter of 0.5 mm or smaller are formed at 10 mm intervals on the gas shower plate 11. At a joint portion between the high-frequency electrode 10 made of aluminum alloy and the gas shower plate 11 made of quartz is disposed an O-ring 13 preventing process gas from leaking into the processing chamber 1. At this time, since the conductance of the gas discharge hole is made smaller than the gas pipe 16 so as to discharge equal amounts of gas through each of the gas discharge holes, the gas pressure at the space between the high-frequency electrode 10 and the gas shower plate 11 is sufficiently higher than the gas pressure of the processing chamber, or approximately 50 Pa or greater, by which the corrosion of the surface of the high-frequency electrode 12 by the process gas is accelerated. Therefore, $Y_2O_3$ ceramic is sprayed to from a thickness of 100 μm on the area of the high-frequency electrode 10 coming into contact with the process gas, and the sprayed surface is sealed with a polymer material so as to form a protecting film 12 preventing process gas from penetrating through the sprayed material to the conductor surface of the high-frequency electrode 10 and cause corrosion of the conductor surface.

The arrangement of the high-frequency electrode 10 can be different from that described in the present embodiment, as long as it has tolerance to corrosion. For example, the high-frequency electrode 10 can be composed of a corrosion-resistant conductor such as gold, platinum and SiC. Further, it is possible to cover the surface composed of stainless steel or aluminum alloy with a polymer coating or a corrosion-resistant metal plating such as gold or platinum.

Figure 3:
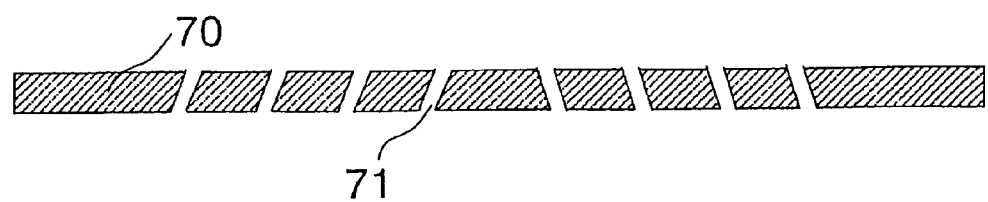
FIG. 3 is a cross-sectional view of a gas shower plate according to the first embodiment of the present invention.

Furthermore, by adopting an arrangement of a gas shower plate 70 illustrated in FIG. 3 as the gas shower plate 11, the gas discharge holes 71 are arranged slantwise with respect to the direction of the plate thickness of the quartz plate, so that the ions accelerated in the plasma and entering the gas discharge holes 71 will not pass through the gas discharge holes and directly sputter the high-frequency electrode disposed on the rear side thereof. According to this arrangement, the gas discharge holes 71 are at angles of 5 to 45 degrees with the direction of the plate thickness of the gas shower plate 70. Moreover, even if the electrons in the plasma are accelerated toward the direction of the plate thickness by the high electric field generated by the high-frequency electrode, the slanted gas discharge holes 71 reduce the acceleration distance of the accelerated electrons, according to which the occurrence of abnormal discharge is suppressed.

Figure 4A:
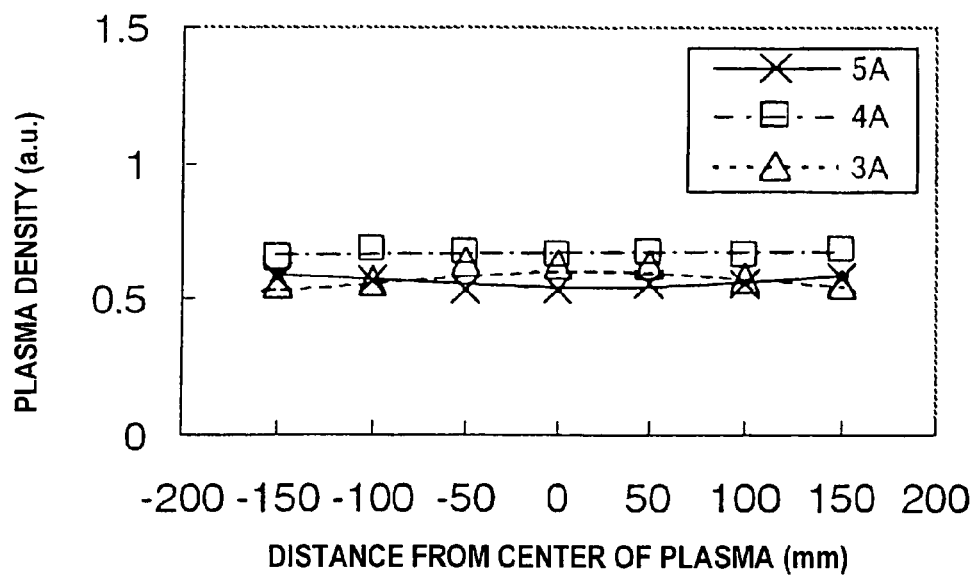
FIG. 4A shows an example of measurement of the plasma density distribution according to the first embodiment of the present invention in which the gas shower plate thickness is 12 mm.
Figure 4B:
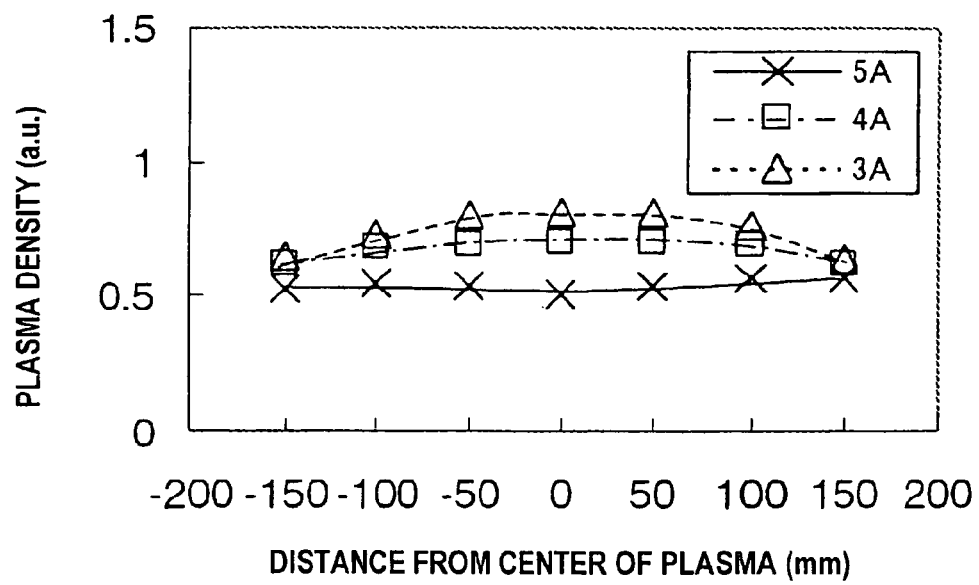
FIG. 4B shows an example of measurement of the plasma density distribution according to the first embodiment of the present invention in which the gas shower plate thickness is 6 mm.

The measurement result of plasma density distribution according to the present embodiment illustrated in FIG. 1 is shown in FIG. 4. FIG. 4 shows the plasma density distribution measured by disposing plasma density measuring probes at the wafer position. FIG. 4A illustrates the case in which the thickness of the gas shower plate is 12 mm, and FIG. 4B illustrates the case in which the thickness of the gas shower plate is 6 mm. A normal condition used for etching Si is used as the discharge condition, wherein the discharge gas is $SF_6$ and $CHF_3$, the gas pressure is 1 Pa, and the discharge power is 500 W. At this time, the current supplied to the electromagnetic coils 25 is switched between 3 A, 4 A and 5 A in order to control the magnetic field intensity applied to the plasma, and to evaluate the controllability of plasma distribution. From measurement results, it can be seen that when the thickness of the quartz is set to 12 mm, the plasma distribution is uniform and stable even with respect to the change in magnetic fields. When the thickness of the quartz is set to 6 mm, the plasma distribution can be varied from a flat distribution to a convex distribution via the magnetic field, so it is advantageous with respect to the controllability of the plasma distribution. It is possible to set the thickness of the quartz panel to be greater than 12 mm, but as the thickness increases, the weight of the plate is increased making it difficult to handle the plate, and the costs of the material and processes for forming gas holes are increased. If the plate thickness is smaller than 6 mm, the plate having a diameter of 350 mm as according to the present embodiment is susceptible to fracture, and the plate is affected by the stress caused by the gas pressure of a few hundred Pa applied on the rear surface of the gas shower plate.

Therefore, according to the present embodiment, it is effective to select the thickness of the quartz within the range of 6 mm to 12 mm according to the object of use.

The plasma processing apparatus of the present embodiment was described with reference to the method for generating plasma using a high-frequency radiation of the VHF band, but the present invention can be applied to other types of plasma processing apparatuses that utilize reactive gas to achieve equivalent effects.

Figure 9:
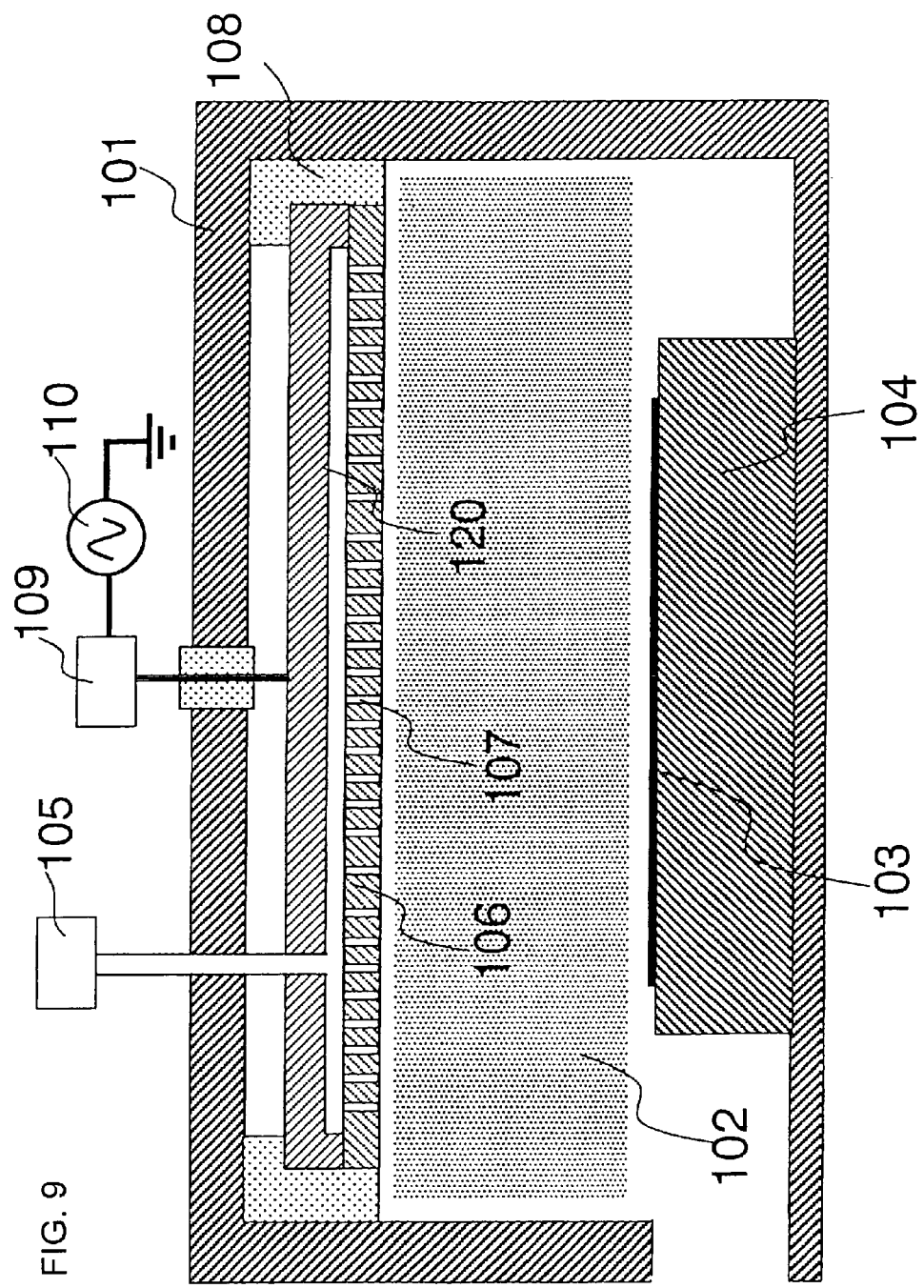
FIG. 9 is a cross-sectional view of a plasma processing apparatus according to the prior art.

However, according to a parallel plate plasma processing apparatus of the prior art as shown in FIG. 9, a high-frequency radiation of 100 MHz or smaller is generally used as the electromagnetic wave for generating plasma, so the suitable thickness of the gas shower plate made of dielectric is varied. The behavior of the electromagnetic waves transmitted inside the dielectric plate can be simply equivalently represented by the capacitor capacity C, and when the dielectric constant of the dielectric is represented by $\in$, the dielectric thickness is represented by d and the dielectric area is represented by s, then C can be expressed by $C=\in s/d$. The impedance Z with respect to the high frequency radiation having a frequency of fHz can be expressed by $Z=1/(2\pi fC)=d/(2\pi f\in s)$. Accordingly, when the frequency f is small, the impedance of the equivalent capacitor with respect to the high frequency radiation becomes equivalent by reducing the thickness d of the dielectric, so if the frequency is smaller than the high-frequency radiation of embodiment 1, it is effective to reduce the plate thickness of the dielectric gas shower plate to be smaller than 6 mm. For example, the most suitable gas shower plate thickness of embodiment 1 is between 6 mm and 12 mm, whereas if the high-frequency radiation is 60 MHz (with a wavelength of 5 m), the most preferable gas shower plate thickness is reduced for 0.3, for a ratio between frequencies (60 M/200 M), which means that the plate thickness should preferably be between 1.8 mm and 3.6 mm. However, the thickness of the gas shower plate is not restricted to these ranges, and can be determined according to the target plasma characteristics.

Figure 5:
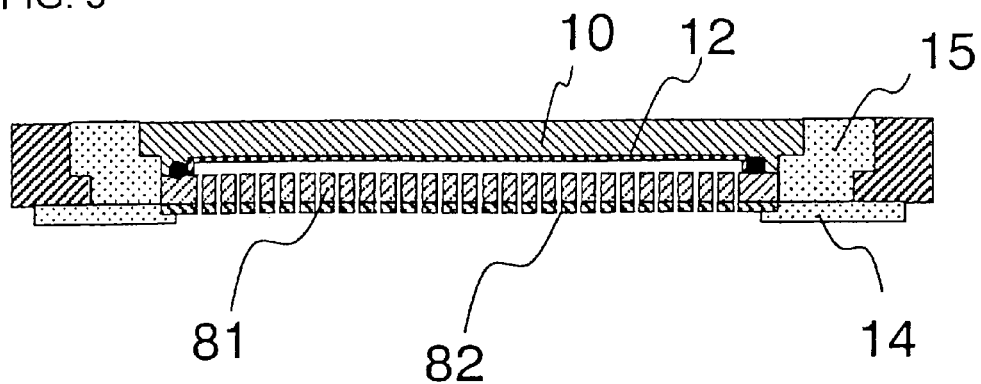
FIG. 5 is a cross-sectional view of a gas shower plate according to a modified example of the first embodiment of the present invention.

FIG. 5 illustrates a modified example of the gas shower plate. According to the embodiment shown in FIG. 1, the gas shower plate 11 is an integrated structure made of quartz, but according to FIG. 5, the gas shower unit is composed of a rear-side gas shower plate 81 and a front-side gas shower plate 82. By using a conductor with an anti-corrosive structure as the rear-side gas shower plate 81 and a dielectric such as quartz as the front-side gas shower plate 82, the quartz thickness exposed to plasma can be made thinner than 6 mm, and high electric field can be applied to the plasma. The rear-side gas shower plate 81 can be formed by applying an anti-corrosive coating to a conductor or a semiconductor, such as Y, SiC, SUS or the like, or Al, having relatively high anti-corrosiveness to reactive gas. The front-side gas shower plate 82 can be formed of a dielectric such as quartz or a ceramic material containing Y, Al, Si, C and the like, such as $Y_2O_3$, $YF_3$, $Ai_2O_3$, $Si_3N_4$, SiC, $B_4C$, and the thickness of the plate can be 1 mm or smaller. If the thickness of the dielectric is 1 mm or smaller, the gas shower plate unit can be formed either by adhering a dielectric sheet onto the surface of the rear-side gas shower plate 81 or by spraying $Y_2O_3$ and the like on the surface of the rear-side gas shower plate 81.

Even according to the embodiment illustrated in FIG. 1, the gas shower plate 11 formed of quartz can adopt a double-layered structure composed of quartz similar to the structure of the rear-side gas shower plate 81 and the front-side gas shower plate 82 of FIG. 5, which enables to reduce costs for replacing components, since only the front-side gas shower plate 82 is to be replaced when the gas shower plate is damaged by plasma after long term use.

Embodiment 2

Figure 6:
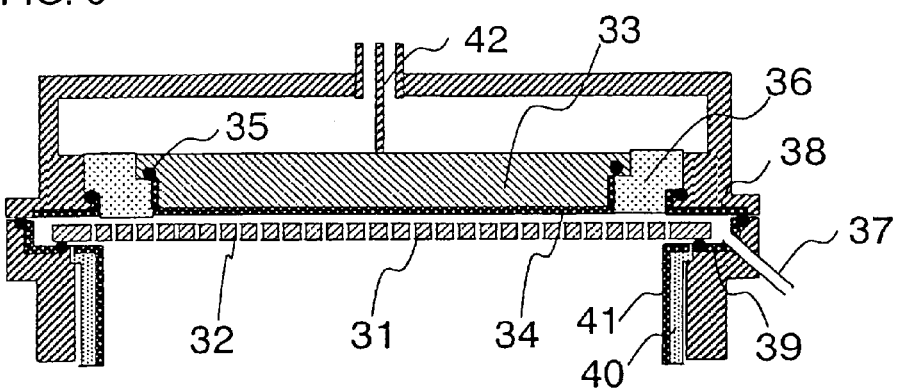
FIG. 6 is a cross-sectional view of a plasma processing apparatus according to a second embodiment of the present invention.

The second embodiment of the present invention will now be described with reference to the schematic view of a plasma processing apparatus of FIG. 6. According to the present embodiment, high-frequency power for generating plasma is supplied to a high-frequency electrode 33 via a coaxial line 42. The high-frequency electrode 33 is disposed in the processing chamber via an insulating member 36 made of quartz and O-rings 35 which maintain the chamber in a vacuum state. The process gas used for processing is supplied through gas discharge holes 32 on a gas shower plate 31 formed of quartz disposed on a front side of the high-frequency electrode 33 to plasma. The process gas is supplied via a gas supply pipe 37 to the space formed at the side wall of the gas shower plate 31. $Y_2O_3$ ceramic is sprayed onto the surface of the space formed at the side wall of the gas shower plate 31 and on the surface of the high-frequency electrode 33 exposed to high-pressure process gas to form coatings 34, 38 and 39, and the coatings are further subjected to sealing treatment by polymer, according to which corrosion caused by process gas can be reduced. Furthermore, by feeding process gas from the sidewall, the lower surface of the high-frequency electrode 33 can be flattened and the coating film 34 can be formed easily via spraying, and the sprayed film will not be susceptible to fracture. Moreover, since the lower surface of the high-frequency electrode 33 is flat, coatings can be formed in various manners, such as by applying polyimide and other polymer coating, by attaching a polymer sheet, or by depositing a protecting film such as SiC and SiO using a normal coating apparatus.

Moreover, since the supplied gas diffuses in the circumferential direction within the space formed at the side wall of the gas shower plate 31 and becomes uniform, the gas supplied through the gas discharge holes 32 is circumferentially uniform.

In order to prevent heavy metal contamination caused by wall materials being subjected to ion sputtering via plasma, an inner cylinder 40 is disposed within the processing chamber with a coating 41 formed on the surface by high-purity $Y_2O_3$ ceramic spraying, preventing heavy metal such as Fe from being mixed into the plasma even when the coating is damaged via ion sputtering.

Embodiment 3

Figure 7:
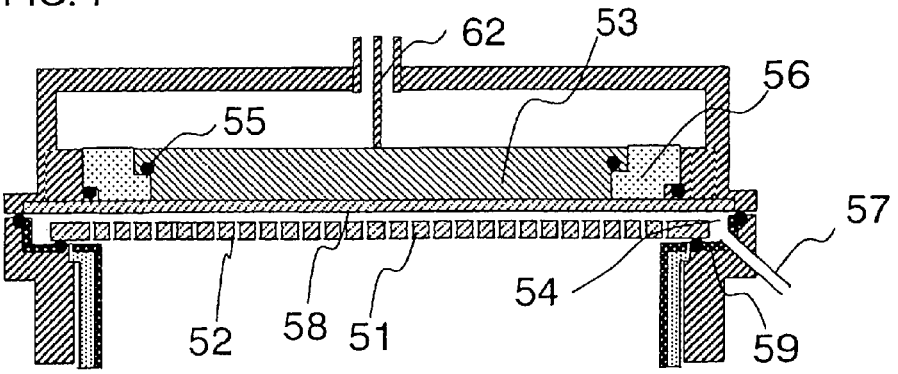
FIG. 7 is a cross-sectional view of a plasma processing apparatus according to a third embodiment of the present invention.

The third embodiment of the present invention will be described with reference to the schematic view of the plasma processing apparatus of FIG. 7. According to the present embodiment, high-frequency radiation used for generating plasma is supplied to a high-frequency electrode 53 via a coaxial line 62. The high-frequency electrode 53 is disposed in the processing chamber via an insulating member 56 made of quartz and O-rings 55 which maintain the chamber in a vacuum state. A protecting plate 58 formed of a quartz panel or a polymer sheet is attached to the surface of the high-frequency electrode 53 and the surface of the conductor constituting the processing chamber. The process gas used for processing is supplied through gas discharge holes 52 on a gas shower plate 51 formed of quartz disposed on a front side of the high-frequency electrode 53 toward plasma. The process gas is supplied via a gas supply pipe 57 to the space formed at the side wall of the gas shower plate 51. A coating 59 is formed by spraying $Y_2O_3$ ceramic onto the surface of the space 54 formed at the side wall of the gas shower plate 51 exposed to high-pressure process gas, and the coating is further subjected to sealing treatment by polymer, according to which corrosion caused by process gas can be reduced. According to this arrangement, the conductor surface of the high-frequency electrode 53 can be prevented infallibly by protecting the same with a relatively thick protecting film 58.

Embodiment 4

Figure 8:
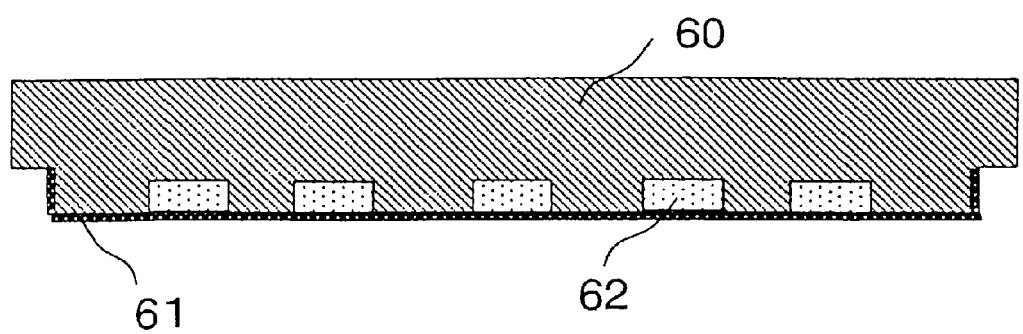
FIG. 8 is a cross-sectional view of a high-frequency electrode according to a fourth embodiment of the present invention.

The fourth embodiment of the present invention will be described with reference to the schematic view of the plasma processing apparatus of FIG. 8. According to the present embodiment, multiple dents 62 are formed on a surface exposed to plasma of the conductor constituting a high-frequency electrode 60 for applying high-frequency radiation to plasma, and the interior of the dents 62 are filled with dielectric such as quartz or ceramic. The dents 62 are formed generally as concentric rings corresponding to the shape of the wafer being the substrate to be processed. Other arrangements such as linear grooves or a number of small-diameter dents can be adopted as dents 62. A coating 61 is formed by spraying $Y_2O_3$ ceramic on the surface of the high-frequency electrode 60 and dents 62 filled with dielectric such as quartz or ceramic, and the coating is further subjected to sealing treatment using polymer. High-frequency radiation is transmitted between the surface of the conductor of the high-frequency electrode 60 and plasma as if transmitted between two metal plates. At this time, by providing dents 62, the impedance of the high-frequency transmission is changed by which the electric field distribution on the lower surface of the high-frequency electrode 60 is changed, and the plasma distribution can thereby be controlled.

Furthermore, corrosion can be prevented by providing a protecting film 61 via spraying ceramic on the electrode surface of the high-frequency electrode 60 facing the plasma on which the process gas contacts via a gas feeding means not shown.

What is claimed is:

1. A plasma processing apparatus capable of subjecting a semiconductor device formed on a substrate to plasma processing using a corrosive gas, comprising:
    a processing chamber for subjecting the semiconductor device formed on the substrate to plasma processing;
    a gas supply means for supplying gas into the processing chamber;
    a source of the corrosive gas, as the gas to be supplied into the processing chamber by the gas supply means; and
    an antenna electrode made of an electrical conductor, for supplying high-frequency radiation to discharge the gas and to generate a plasma,
    wherein the gas supply means includes a gas shower plate, having gas discharge holes, which discharges gas into the processing chamber,
    wherein a space is formed between the electrical conductor of the antenna electrode, disposed at an antenna-electrode-side of the gas supply means, and the gas shower plate, into which space is supplied the corrosive gas,
    wherein a whole of a surface of the electrical conductor of the antenna electrode, disposed at the antenna-electrode-side of the gas supply means, which would be exposed to the corrosive gas, is covered by a ceramic coating on the antenna electrode, formed by ceramic spraying, and on the ceramic coating is coated a layer of a polymer material, so as to prevent the corrosive gas from penetrating through the ceramic coating to the antenna electrode made of the electrical conductor,
    wherein the gas in the space is supplied to the processing chamber through the gas shower plate,
    wherein the gas shower plate is composed of quartz having a thickness of 3 mm or greater and 10 mm or smaller,
    wherein the high-frequency radiation has a frequency ranging between 100 MHz and 500 MHz, and
    wherein the space formed between the electrical conductor of the antenna electrode, disposed at the antenna-electrode-side of the gas supply means, and the gas shower plate, is a gap therebetween which is 0.5 mm or smaller.

2. The plasma processing apparatus according to claim 1, wherein the gas discharge holes are formed at angles of 5 to 45 degrees to the direction of plate thickness of the gas shower plate.

3. The plasma processing apparatus according to claim 1, wherein a base material of the antenna electrode is aluminum or an alloy thereof, and wherein an anodized aluminum coating is provided on the electrical conductor of the antenna electrode, between the electrical conductor and the ceramic coating formed by the ceramic spraying.

4. The plasma processing apparatus according to claim 1, wherein the ceramic coating formed by the ceramic spraying includes at least one element selected from the group consisting of Al, Si and Y.

5. The plasma processing apparatus according to claim 4, wherein ceramic material of the ceramic coating is selected from the group consisting of $Al_2O_3$, SiC and $Si_3N_4$.

6. The plasma processing apparatus according to claim 1, wherein said gas shower plate is a body of quartz, exposed to said space.

7. The plasma processing apparatus according to claim 6, wherein said body of quartz is a single body, and is also exposed to said processing chamber.

8. The plasma processing apparatus according to claim 1, wherein the processing chamber is provided therein with an electrode for supporting the semiconductor device, and wherein the gas shower plate is provided between the electrode for supporting the semiconductor device and the antenna electrode.

* * * * *